US009219216B2

(12) United States Patent
Higashida et al.

(10) Patent No.: US 9,219,216 B2
(45) Date of Patent: Dec. 22, 2015

(54) THERMOELECTRIC CONVERSION ELEMENT, THERMOELECTRIC CONVERSION ELEMENT MODULE, AND METHOD OF MANUFACTURING THE SAME

(75) Inventors: Takaaki Higashida, Osaka (JP); Kaori Toyoda, Hyogo (JP); Takashi Kubo, Osaka (JP); Yoshihisa Ohido, Osaka (JP); Nobuaki Hirata, Osaka (JP); Yasushi Taniguchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 344 days.

(21) Appl. No.: 13/880,450

(22) PCT Filed: Nov. 18, 2011

(86) PCT No.: PCT/JP2011/006455
§ 371 (c)(1),
(2), (4) Date: Apr. 19, 2013

(87) PCT Pub. No.: WO2012/066788
PCT Pub. Date: May 24, 2012

(65) Prior Publication Data
US 2013/0199593 A1    Aug. 8, 2013

(30) Foreign Application Priority Data
Nov. 18, 2010   (JP) ................................ 2010-257591

(51) Int. Cl.
*H01L 35/32*       (2006.01)
*H01L 35/08*       (2006.01)
*H01L 35/34*       (2006.01)

(52) U.S. Cl.
CPC ................ *H01L 35/32* (2013.01); *H01L 35/08* (2013.01); *H01L 35/34* (2013.01)

(58) Field of Classification Search
CPC ......... H01L 35/00; H01L 35/02; H01L 35/04; H01L 35/08; H01L 35/28; H01L 35/32; H01L 35/34; H01L 35/12
See application file for complete search history.

(56) References Cited

U.S. PATENT DOCUMENTS

| 7,365,264 B2 | 4/2008 | Moriyama et al. |
| 2005/0000558 A1 | 1/2005 | Moriyama et al. |

(Continued)

FOREIGN PATENT DOCUMENTS

| CN | 101080824 A | 11/2007 |
| EP | 1835551 A1 | 9/2007 |

(Continued)

OTHER PUBLICATIONS

International Search Report for Application No. PCT/JP2011/006455 dated Aug. 20, 2012.

*Primary Examiner* — Christina Chern
(74) *Attorney, Agent, or Firm* — Pearne & Gordon LLP

(57) ABSTRACT

The present invention provides a thermoelectric conversion element, a thermoelectric conversion element module, and a method of manufacturing the same that can easily realize high-density arrangement of thermoelectric conversion elements and securement of connection reliability. The thermoelectric conversion element has, for example, rod-shaped thermoelectric conversion material, tube that has an insulation property and an adiabatic property and houses thermoelectric conversion material, and electrodes that are in close adhesion to the end surfaces of thermoelectric conversion material and tube. A surface roughness Ra of the end surfaces is larger than 0.8 micrometers. In the present invention, the thermoelectric conversion elements can be arranged at a high density such that tubes are in close adhesion to each other. Also, since the close adhesion surface of electrodes on the end surfaces is large, the connection reliability of electrodes is further improved.

7 Claims, 17 Drawing Sheets

(56) References Cited

U.S. PATENT DOCUMENTS

| | | |
|---|---|---|
| 2008/0135082 A1 | 6/2008 | Hirono et al. |
| 2011/0298080 A1 | 12/2011 | Hiroyama |
| 2013/0014796 A1 | 1/2013 | Tajima |

FOREIGN PATENT DOCUMENTS

| | | |
|---|---|---|
| JP | 61-201484 A | 9/1986 |
| JP | 09-321350 A | 12/1997 |
| JP | 11-261118 A | 9/1999 |
| JP | 11-261119 A | 9/1999 |
| JP | 11-298053 A | 10/1999 |
| JP | 2001-148519 A | 5/2001 |
| JP | 2002-359407 A | 12/2002 |
| JP | 2003-197981 A | 7/2003 |
| JP | 2003-298122 A | 10/2003 |
| JP | 2004-221504 A | 8/2004 |
| JP | 2007-013000 A | 1/2007 |
| JP | 2009-164498 A | 7/2009 |
| JP | 2010-165843 A | 7/2010 |
| WO | 2011/118341 A1 | 9/2011 |

(a)

(b)

THERMOELECTRIC CONVERSION ELEMENT, THERMOELECTRIC CONVERSION ELEMENT MODULE, AND METHOD OF MANUFACTURING THE SAME

TECHNICAL FIELD

The present invention relates to a thermoelectric conversion element, a thermoelectric conversion element module, and a method of manufacturing the same.

BACKGROUND ART

For a thermoelectric conversion element, an element providing the Peltier effect or the Seebeck effect is used. In recent years, use of this thermoelectric conversion element in a wide range is attracting people's attention because the structure is simple and the handling is easy so that stable characteristics can be maintained. In particular, as an electronic cooling element among the thermoelectric conversion elements, studies in a wide range are made towards optoelectronics, isothermalizing semiconductor lasers, and the like because local cooling and precision temperature control around room temperature can be made.

Referring to FIG. 17, the electronic cooling element described above or a thermoelectric module used for thermoelectric power generation is constructed in such a manner that p-type element (p-type thermoelectric conversion material) 5 and n-type element (n-type thermoelectric conversion material) 6 are joined via joining electrode (metal electrode) 7 to form a p-n element pair, and a plurality of the p-n element pairs are arranged in series. Current introduction terminals 8 and 9 are connected to joining electrodes 7 at the two ends of the series arrangement, respectively. Joining electrodes 7 are further sandwiched from the outside by a pair of ceramic substrates 10. At this time, the thermoelectric module is constructed in such a manner that one end of p-type element 5 and n-type elements 6 are heated and the other ends are cooled depending on a direction of the electric current that flows through a joining part. To this thermoelectric module, the heat flows in a direction of arrow H.

As the material for p-type element 5 and n-type element 6, the material having a large performance index Z is used.
[Math. 1]

A crystal material generally used as the material of p-type element 5 and n-type elements 6 is a $Bi_2Te_3$ material; however, the crystal material has a considerable cleavage property, and it is known in the art that, after passing through a slicing and dicing step or the like for obtaining a thermoelectric element from an ingot, there is raised a problem of an extremely low yield because of breakage or cracking.

In order to solve the problem, a method of manufacturing a thermoelectric conversion element module is attempted, the method comprising: heating step of mixing material powders to have a desired composition and heating and fusing the mixture; solidifying step of forming a solid-solution ingot of thermoelectric semiconductor materials having a rhombohedron structure (hexagonal crystal structure); a crushing step of crushing the solid-solution ingot to form a solid-solution powder; granulating step of uniformizing the particle size of the solid-solution powder; sintering step of pressurizing and sintering the solid-solution powder having a uniformized particle size; and hot thrashing forging step of performing hot plastic deformation for flatting the sintered powder body, thereby the crystal grains of the sintered powder structure is made to be oriented in a crystal orientation so as to obtain the excellent performance index (See, for example, Patent Literature 1).

Also, as a conventional method of manufacturing a thermoelectric conversion element module, there is known a manufacturing step including the steps of: producing an alloy ingot; crushing the alloy ingot in a vacuum or inert gas atmosphere containing an oxygen concentration of 100 ppm or less to obtain a source powder having an average particle size of 0.1 micrometers or more and less than 1 micrometer; and sintering the source powder by resistance heating while applying a pressure. The sintering step of the method comprises applying a pulsing electric current to the source powder for sintering by the Joule heat, and applying a pressure of 100 $kg/cm^2$ or more and 1,000 $kg/cm^2$ or less (9.8 to 98 MPa) to the source powder during the sintering. Through this sintering step, a particle made of a thermoelectric conversion material having a fine crystal size and having an excellent in processability is proposed (See, for example, Patent Literature 2).

Also, there is known a method of manufacturing a thermoelectric conversion element in which a melt of each of n-type and p-type semiconductors is sucked up into a fine quartz or glass pipe and solidifying the melt as it is, followed by cutting into a predetermined length to obtain a rod-shaped element (See, for example, Patent Literature 3).

CITATION LIST

Patent Literature

[PTL 1]
Japanese Patent Application Laid-Open (JP-A) No. 11-261119
[PTL 2]
Japanese Patent Application Laid-Open (JP-A) No. 2003-298122
[PTL 3]
Japanese Patent Application Laid-Open (JP-A) No. 61-201484

SUMMARY OF INVENTION

Technical Problem

However, in a thermoelectric conversion element module, a temperature difference between the high-temperature side/low-temperature side is needed, so that a thermal stress is generated in the thermoelectric conversion element and the interconnect part by the difference in thermal expansion deriving from the temperature difference. For this reason, when the temperature difference is raised in order to obtain a large potential, the stress on the joining part of the thermoelectric conversion material and the electrode will be large in the above-described conventional construction, so that the reliability of the thermoelectric conversion element module itself will decrease. Also, since the manufacture is made by mounting the thermoelectric conversion materials one by one individually, a high-density arrangement is difficult, thereby leaving a problem of small output that can be taken out.

The present invention solves the above problems of the prior art, and an object thereof is to provide a thermoelectric conversion element and a thermoelectric conversion element module facilitating a high-density arrangement and having a high connection reliability, and a method of manufacturing the same.

Solution to Problem

In order to achieve the above object, the present invention of the following is provided. A thermoelectric conversion element of the present invention comprises: a p-type or n-type thermoelectric conversion material filled in the inside of a hollow tube made of heat-resistant insulating material; and, an electrode that adheres to an end surface of the hollow tube and an end surface of the thermoelectric conversion material; in which a surface roughness Ra on an end surface of the hollow tube and an end surface of the thermoelectric conversion material is larger than 0.8 micrometers and 4.5 micrometers or less.

Since the thermoelectric conversion element of the present invention comprises the p-type or n-type thermoelectric conversion material filled in the inside of a hollow tube, the thermoelectric conversion elements can be arranged to be in contact with one another, so that a high-density arrangement of the thermoelectric conversion elements is easy to be achieved. Also, since the electrode adheres to the end surfaces whose surface roughness Ra is larger than 0.8 micrometers and 4.5 micrometers or less, the thermoelectric conversion element of the present invention has a high close adhesion property of the electrode and has a high reliability of electrical connection as compared with the adhesion of the electrode only to the end surface of the thermoelectric conversion material.

In the thermoelectric conversion element of the present invention, it is more preferable that the end surface of the thermoelectric conversion material is concaved by 3 to 5 micrometers relative to the end surface of the hollow tube for enhancing the close adhesion property of the electrode to the end surface of the hollow tube.

A method of manufacturing a thermoelectric conversion element of the present invention includes the steps of: filling a pipe made of a heat-resistant insulating material with a p-type or n-type thermoelectric conversion material so as to align a crystal orientation of the thermoelectric conversion material in an axial direction of this pipe (step 1); cutting the pipe (step 2); and forming an electrode that adheres to a cut surface of the cut pipe and a cut surface of the thermoelectric conversion material in the pipe (step 3). A surface roughness Ra of the cut surface of the thermoelectric conversion material and the cut surface of the cut pipe is larger than 0.8 micrometers and 4.5 micrometers or less.

The step 1 may include a step of filling the inside of the pipe with the p-type or n-type thermoelectric conversion material, thereafter closing an end of the pipe, and fusing the thermoelectric conversion material by heating the pipe filled with the thermoelectric conversion material. Alternatively, the step 1 may include a step of introducing a fused thermoelectric conversion material into the inside of the pipe through the one end of the pipe which is set in the fused thermoelectric conversion material, which is achieved by sucking the fused thermoelectric conversion material through the pipe.

A thermoelectric conversion element module of the present invention comprises: a p-type thermoelectric conversion element including a p-type thermoelectric conversion material filled in the inside of a hollow tube made of heat-resistant insulating material; and an n-type thermoelectric conversion element including a n-type thermoelectric conversion material filled in the inside of a hollow tube made of heat-resistant insulating material. The p-type thermoelectric conversion element and the n-type thermoelectric conversion element are electrically connected in series and are arranged in parallel to each other. The p-type and n-type thermoelectric conversion elements can serve as the thermoelectric conversion elements of the present invention described above.

In the thermoelectric conversion element module of the present invention, it is preferable that a plurality of the p-type thermoelectric conversion elements and a plurality of the n-type thermoelectric conversion elements are arranged in parallel to form a p-type thermoelectric conversion element group and an n-type thermoelectric conversion element group, respectively. And also, the p-type thermoelectric conversion element group and the n-type thermoelectric conversion element group are electrically connected in series for facilitating the electrical connection of the elements during the manufacture of the module and obtaining a larger electric current of the module. From such a viewpoint, it is more preferable that the p-type thermoelectric conversion element group and the n-type thermoelectric conversion element group are alternately arranged, and it is more preferable that the p-type thermoelectric conversion element group and the n-type thermoelectric conversion element group are arranged to be adjacent to each other.

Also, it is preferable that the thermoelectric conversion element module of the present invention further has an arrangement consisting of a plurality of a hollow tube made of heat-resistant insulating material, the arrangement constituting a part or a whole of the outer circumference of an assembly consisting of all of the p-type thermoelectric conversion element groups and the n-type thermoelectric conversion element groups. Thereby, the precision of arrangement of the elements in the module can be improved, and an electric interconnect for taking out the electric current from the module can be separated from the end surface of the element.

A method of manufacturing a thermoelectric conversion element module of the present invention includes the steps of: filling a pipe made of a heat-resistant insulating material with a p-type or n-type thermoelectric conversion material so as to align a crystal orientation of the thermoelectric conversion material in an axial direction of the pipe; arranging the pipe filled with the p-type thermoelectric conversion material and the pipe filled with the n-type thermoelectric conversion material in parallel to each other; bonding the pipes arranged in parallel to each other to obtain an assembly; cutting the pipes of the assembly; and forming an electrode that adheres to cut surfaces of the cut pipes and cut surfaces of the thermoelectric conversion materials filled in the cut pipes, so as to electrically-connect the p-type thermoelectric conversion material and the n-type thermoelectric conversion material alternately in series. And also, a surface roughness Ra of the cut surfaces of the thermoelectric conversion materials and the cut surfaces of the cut pipes is larger than 0.8 micrometers and 4.5 micrometers or less.

By the construction described above, it is possible to realize a method of manufacturing a thermoelectric conversion element module having a high electrical connection reliability of the electrode in the thermoelectric conversion element and facilitating a high-density arrangement.

In the step of arranging, it is preferable that pipes filling with no p-type or n-type thermoelectric conversion material are further arranged at the periphery of the assembly in which the pipe filled with the p-type thermoelectric conversion material and the pipe filled with the n-type thermoelectric conversion material are arranged in parallel. Thereby, the pipes filling with no thermoelectric conversion material constitute a part or a whole of the outer circumference of the assembly. This configuration can improve the precision of arrangement of the elements in the module and can separate an electric interconnect for taking out the electric current from the module from the end surface of the element.

Advantageous Effects of Invention

As described above, according to the thermoelectric conversion element, the thermoelectric conversion element module, and the method of manufacturing the same of the present invention, a thermoelectric conversion element and a thermoelectric conversion element module facilitating a high-density arrangement and having a high connection reliability can be obtained.

DESCRIPTION OF EMBODIMENTS

Hereafter, embodiments of the present invention will be described with reference to the drawings.

Figure 1:
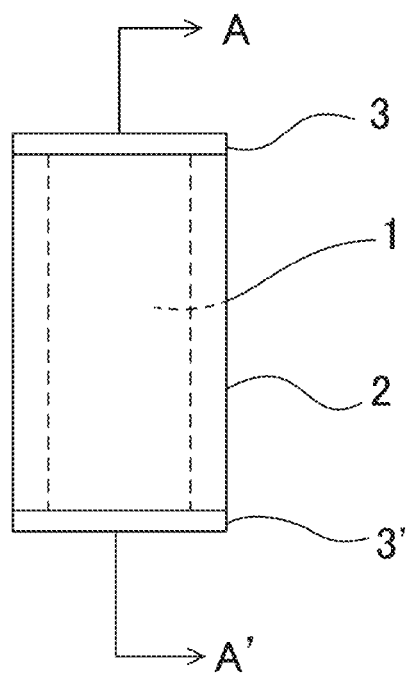
FIG. 1 is a view showing an outlook of one example of a thermoelectric conversion element of the present invention.

One example of a thermoelectric conversion element of the present invention is shown in FIG. 1. The thermoelectric conversion element has rod-shaped thermoelectric conversion material 1, tube 2 that covers the circumferential surface of thermoelectric conversion material 1, and electrodes 3 and 3' that adhere to end surface of thermoelectric conversion material 1 and end surface of tube 2.

Thermoelectric conversion material 1 is a rod-shaped member formed of a material that generates electromotive force when a temperature difference is generated between the two ends. A material of thermoelectric conversion material 1 can be selected in consideration of the temperature difference that is generated when using. Examples of the thermoelectric conversion material include a bismuth•tellurium series (Bi—Te series) when the temperature difference is from ordinary temperature to 500K, a lead•tellurium series (Pb—Te series) when the temperature difference is from ordinary temperature to 800K, and a silicon•germanium series (Si—Ge series) when the temperature difference is from ordinary temperature to 1000K.

The p-type thermoelectric conversion material or the n-type thermoelectric conversion material can be obtained, for example, by adding a suitable dopant to the above-described thermoelectric conversion material. An example of the dopant for obtaining the p-type thermoelectric conversion material includes Sb. An example of the dopant for obtaining the n-type thermoelectric conversion material includes Se. By addition of these dopants, the thermoelectric conversion material forms a mixed crystal. Therefore, these dopants are added to the thermoelectric conversion material, for example, in an amount of a degree represented by a compositional formula of the thermoelectric conversion material such as "$Bi_{0.5}Sb_{1.5}Te_3$" or "$Bi_2Te_{2.7}Se_{0.3}$".

The shape of thermoelectric conversion material 1 is preferably such that one end surface and the other end surface are arranged opposite to each other for generating a temperature difference between the two ends of the thermoelectric conversion material when using the thermoelectric conversion element or the thermoelectric conversion element module. Thermoelectric conversion material 1 need not be in close contact with the inner circumferential surface of tube 2; however, it is preferably in close contact with the inner circumferential surface of tube 2 in view of improving the productivity of the element. The shape of thermoelectric conversion material 1 is preferably a polygonal column or a circular cylinder, more preferably a circular cylinder, in view of the productivity of the element and of the alignment of the crystal orientation of the thermoelectric conversion material in an axial direction of the tube.

The length of thermoelectric conversion material 1 in the axial direction of tube 2 is preferably 1.0 to 3.0 mm, more preferably 1.0 to 2.0 mm, most preferably 1.5 to 2.0 mm, in view of generating a suitable temperature difference between the two ends of the thermoelectric conversion material. Also, the length of thermoelectric conversion material 1 in a direction perpendicular to the axial direction of tube 2 (width of thermoelectric conversion material 1) is preferably 0.5 to 3.0 mm, more preferably 1.0 to 2.0 mm, in view of reducing the electric resistance of the thermoelectric conversion material.

Tube 2 is a member having a hollow structure that is open to both ends and that is made of a material having a heat resistance and an insulation property. Tube 2 has a heat resistance of stably keeping its shape even at a temperature of one end at the high-temperature side when using the element or at a melting point of the thermoelectric conversion material. Also, tube 2 has an insulation property for blocking the electric current of thermoelectric conversion material 1 when using the element. Tube 2 corresponds to the "hollow tube made of heat-resistant insulating material" in the present invention. It is sufficient that tube 2 can be filled with thermoelectric conversion material 1 and has a heat resistance and an insulation property. Tube 2 is preferably a circular cylinder for arranging the elements at a high density in a module. Examples of a material of tube 2 include: a metal oxide such as silica or alumina; a heat-resistant glass; quartz; or the like. The material of tube 2 is preferably quartz in view of heat resistance, and is preferably a heat resistant glass further in view of the costs.

The surface roughness of end surfaces 4 and 4' of both thermoelectric conversion material 1 and tube 2 is larger than 0.8 micrometers and smaller than or equal to 4.5 micrometers in terms of the central line average roughness Ra in view of bringing electrodes 3 and 3' into close adhesion to the end surfaces at a sufficient strength. The surface roughness Ra may be adjusted by polishing with a file. The surface roughness Ra of end surfaces 4 and 4' is measured by a step difference meter, for example, Tencor P-10 (manufactured by KLA-Tencor Co., Ltd.). The end surfaces to be measured are exposed by removing electrodes 3 and 3'. Removal of electrodes 3 and 3' from end surfaces 4 and 4' can be carried out by peeling electrodes 3 and 3' off from end surfaces 4 and 4'. Such removal of electrodes 3 and 3' can be carried out, for example, by soldering electrodes 3 and 3' to a substrate (for example, a substrate made of copper), and subsequently pulling thermoelectric conversion material 1 and tube 2 in the axial direction of tube 2 to separate them from the substrate. The substrate has a high joining strength to solder as compared with a joining strength between thermoelectric conversion material 1 and electrodes 3 and 3'.

Electrodes 3 and 3' are respectively in close contact with end surfaces 4 and 4' of a thermoelectric conversion member in which thermoelectric conversion material 1 is filled in tube 2. Electrodes 3 and 3' may be in close contact with the whole of end surfaces 4 and 4' of the thermoelectric conversion member, or may be in close contact with only a part of end surfaces 4 and 4' of the thermoelectric conversion member, provided that electrodes 3 and 3' are at least in close contact with the end surface of thermoelectric conversion material 1. Electrodes 3 and 3' may be formed independently in each element; however, in a module including a plurality of elements, electrodes 3 and 3' may be formed commonly to the other elements. The thickness of electrodes 3 and 3' (B in FIG. 3) is preferably 10 to 15 micrometers in view of compatibility between the reliability of electrical connection and the restraint of electric resistance. Electrodes 3 and 3' can be formed, for example, by vapor deposition of metal, sputtering, or thermal spraying. The material of electrodes 3 and 3' preferably has a sufficient close adhesion property to both of thermoelectric conversion material 1 and tube 2. For example, when thermoelectric conversion material 1 is bismuth•tellurium series and tube 2 is a heat resistant glass, examples of the material of electrodes 3 and 3' include an alloy containing two or more of Bi, Cu, Sb, and In.

Here, the thermoelectric conversion member may have an underlayer metal on end surfaces 4 and 4' thereof. The underlayer metal is a metal layer for enhancing the joining property between end surfaces 4 and 4' and electrodes 3 and 3', respectively. The thickness of the underlayer metal is preferably 0.5 to 2.0 micrometers in view of exhibiting a desired joining property and restraint of electric resistance. The metal as the underlayer metal can join in a good manner at least to thermoelectric conversion material 1 and electrodes 3 and 3', preferably to thermoelectric conversion material 1, tube 2, and electrodes 3, 3'. For example, when thermoelectric conversion material 1 is a Bismuth•tellurium series material and tube 2 is a heat-resistant glass, the underlayer metal is preferably Ni. When the thermoelectric conversion member has both of the underlayer metal and electrodes 3 and 3', the thickness of electrodes 3 and 3' ("B" in FIG. 3) means a total thicknesses of the underlayer metal and electrodes 3 and 3'.

Figure 2:
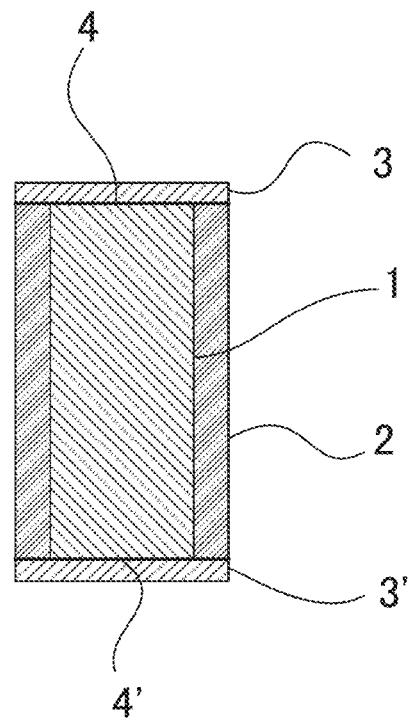
FIG. 2 is a view showing a cross-section of the thermoelectric conversion element when the thermoelectric conversion element is cut along the line A-A' of FIG. 1.
Figure 3:
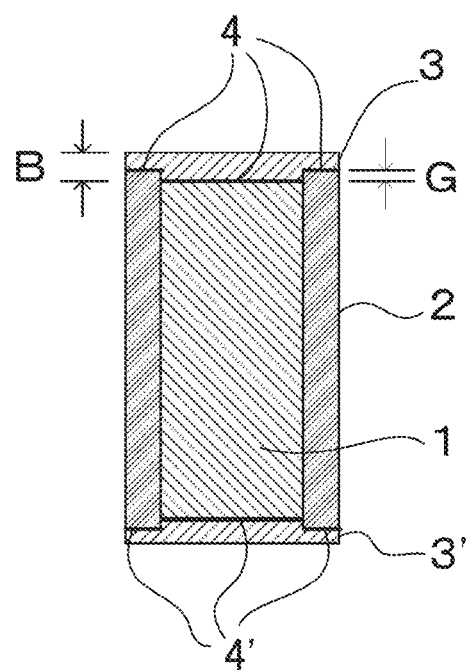
FIG. 3 is a view showing a cross-section of a thermoelectric conversion element of another example of the present invention.

End surfaces 4 and 4' of the thermoelectric conversion member may be flat as shown in FIG. 2, or may be made of an end surface of tube 2 and an end surface of thermoelectric conversion material 1 that is concaved relative to the end surface of tube 2 as shown in FIG. 3. When electrodes 3 and 3' are formed on end surfaces 4 and 4' having a shape shown in FIG. 3, end surfaces 4 and 4' and electrodes 3 and 3' are hard to be shifted from each other in a horizontal direction of end surfaces 4 and 4' of the thermoelectric conversion member, whereby the connection strength of the electrodes to end surfaces 4 and 4' is further enhanced. The distance between the end surface of tube 2 and the end surface of thermoelectric conversion material 1 in the axial direction of tube 2 (G in FIG. 3) is preferably 3 to 5 micrometers in view of realization of a preferable thickness of electrodes 3 and 3', of an effect of improving the mechanical strength of the connection between the thermoelectric conversion member and electrodes 3 and 3', and of restraint of the electric resistance of each element in the thermoelectric conversion element module.

Figure 4:
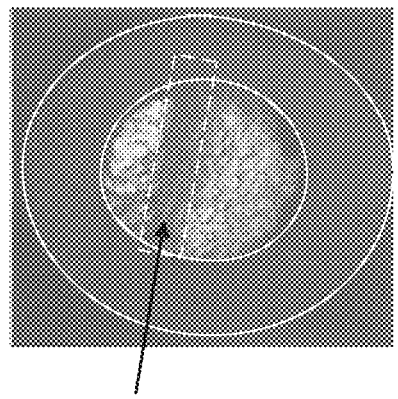
FIG. 4 is a view (photograph) showing unevenness of an end surface of a thermoelectric conversion member.
Figure 4:
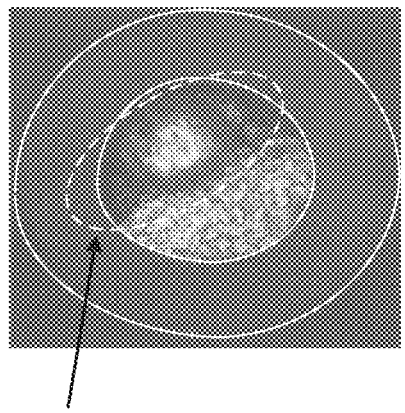

In FIG. 3, an appearance is shown in which the end surface of thermoelectric conversion member 1 is uniformly concaved relative to the end surface of tube 2; however, the end surface of thermoelectric conversion member 1 may be non-uniformly concaved as shown in FIG. 4(a) or 4(b). For example, in FIG. 4(a), the end surface of thermoelectric conversion member 1 has concaved linear portion in a part surrounded by a broken line. Also, in FIG. 4(b), the end surface of thermoelectric conversion member 1 has concaved semicircular portion in a part surrounded by a broken line. Here, the spherical object seen in the part surrounded by a broken line in FIG. 4(b) is a dummy portion for plating.

Figure 5:
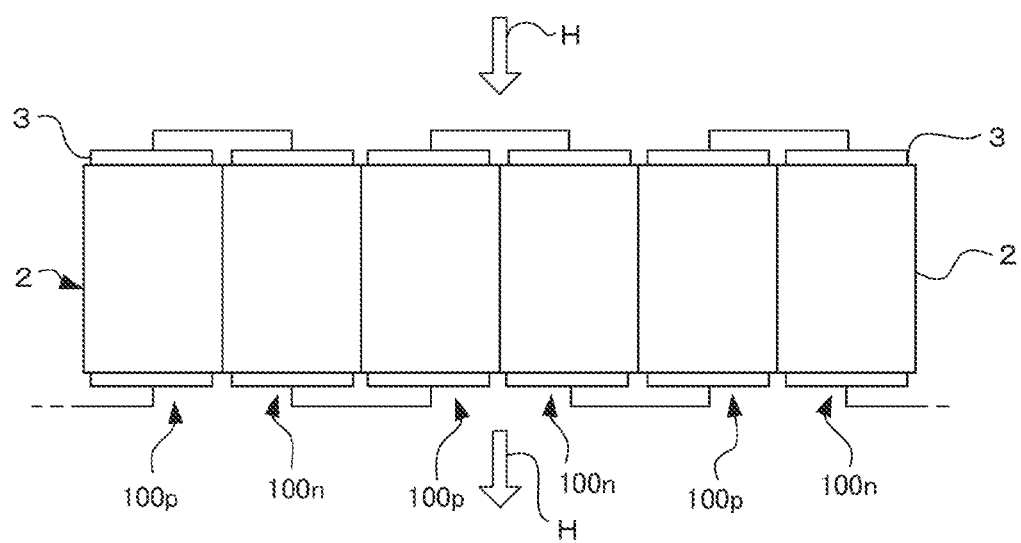
FIG. 5 is a view showing one example of a thermoelectric conversion element module by the thermoelectric conversion elements of FIG. 1.

Referring to FIG. 5, the thermoelectric conversion element module can be constructed by arranging p-type thermoelectric conversion member and n-type thermoelectric conversion member 100n in parallel to each other and electrically connecting in series. P-type thermoelectric conversion member 100p and n-type thermoelectric conversion member 100n are constructed in the same manner as the above-described thermoelectric conversion elements shown in FIGS. 1 to 3. Here, "parallel arrangement" means that the thermoelectric conversion elements, the thermoelectric conversion members, the thermoelectric conversion element groups, or the thermoelectric conversion member groups are in a parallel positional relationship relative to the axial direction of tube 2 in an arbitrary thermoelectric conversion element. When using the thermoelectric conversion element module, the "axial direction of tube 2" is a direction of the flow of heat that passes across the thermoelectric conversion module (for example, the arrow H in FIG. 5). In the thermoelectric conversion element module of FIG. 5, p-type thermoelectric conversion member 100p and n-type thermoelectric conversion member 100n are arranged in parallel to each other and arranged alternately. Further, p-type thermoelectric conversion member 100p and n-type thermoelectric conversion member 100n are electrically connected in series. Such arrangement of p-type thermoelectric conversion member 100p and n-type thermoelectric conversion member 100n is preferable in view of reducing the connection distance of individual electrodes.

When heat is supplied in the direction of arrow H in FIG. 5, a temperature difference is generated between one end on the upstream side of the arrow H direction and the other end on the downstream side of the arrow H direction, whereby electricity is generated and taken out from the module through each thermoelectric conversion element. Thermoelectric conversion element module can be used for power generation, for example, by disposing one end side of the thermoelectric conversion element to face a comparatively high-temperature region, and by disposing the other end side of the thermoelectric conversion element to face a comparatively low-temperature region. The comparatively high-temperature region can be a heat discharging line in a factory that needs a high-heat operation, a burning chamber or a heat discharging line in burning facilities, or an outside of a room for freezing or cooling equipment. The comparatively low-temperature region can be an atmosphere of ordinary temperature or an inside of the room for freezing or cooling equipment.

A method of manufacturing the above-described thermoelectric conversion element will be described as follows.

Figure 6:
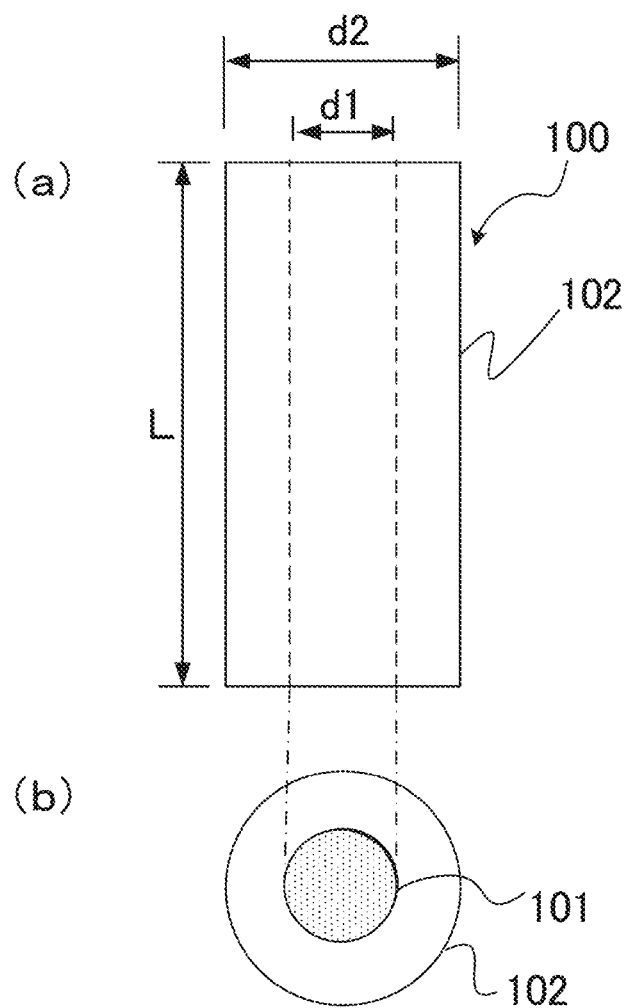
FIG. 6 is a view showing one example of a thermoelectric conversion member according to the present invention.

FIG. 6 shows thermoelectric conversion member 100 according to one embodiment of the present invention. FIG. 6(a) is a side view, and FIG. 6(b) is a bottom view.

In these Figures, the reference numeral 101 denotes a thermoelectric conversion material, and the reference numeral 102 denotes a tube having a heat resistance property and an insulation property described above, where thermoelectric conversion material 101 and tube 102 are constructed to be in a state of close adhesion to each other.

Figure 7:
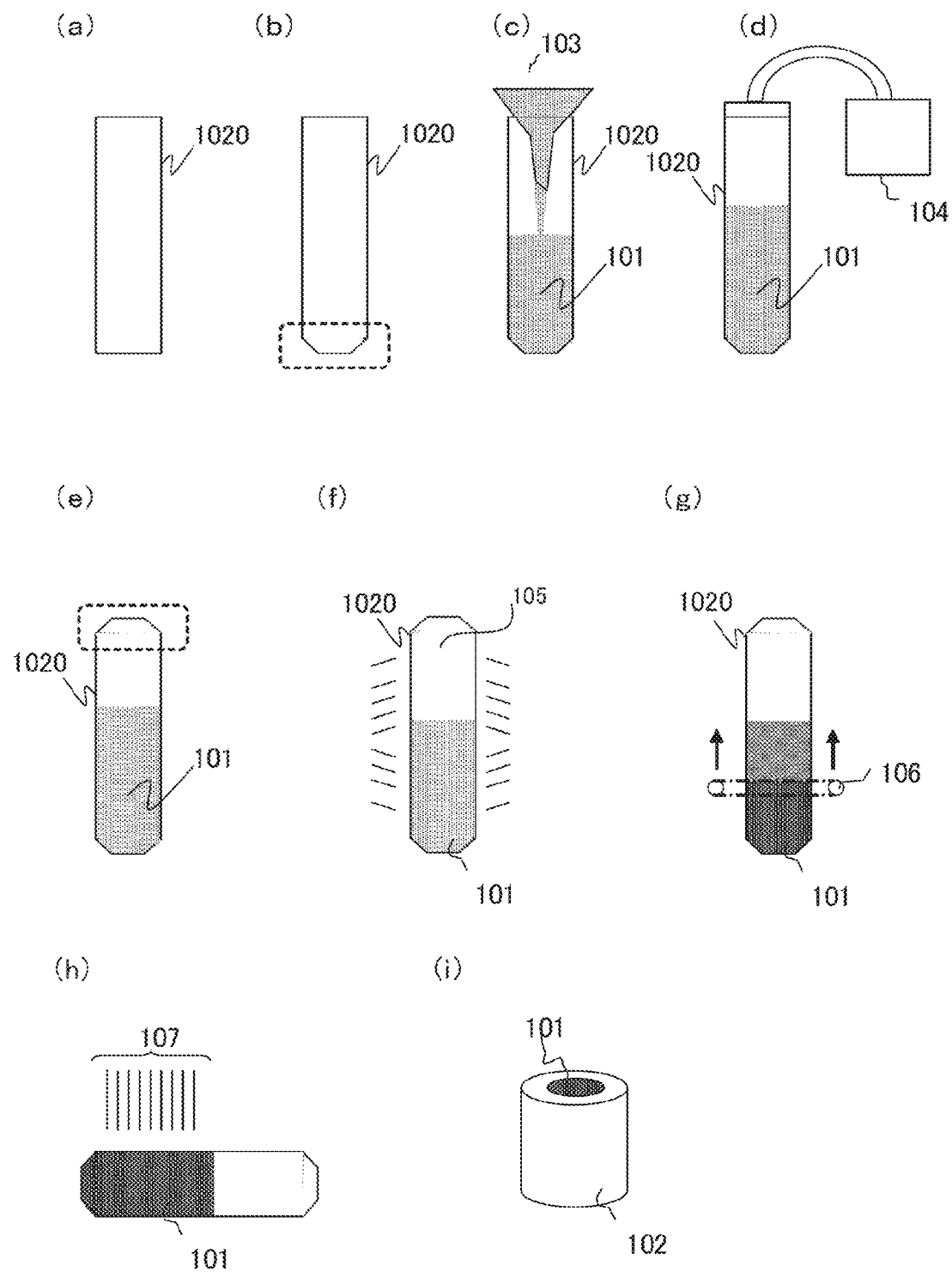
FIG. 7 is a view schematically showing one example of a process for manufacturing the thermoelectric conversion member of FIG. 6.

The steps of manufacturing thermoelectric conversion member 100 of FIG. 6 will be described with reference to FIG. 7.

First, referring to FIG. 7(a), pipe 1020 having a heat resistance property and an insulation property is prepared. Material of pipe 1020 can be glass, particularly a heat-resistant glass (a material made of one kind of borosilicate glass obtained by mixing $SiO_2$ and $B_2O_3$ and having a thermal expansion coefficient of about $3\times10^{-6}$/K). A Pyrex (registered trademark) glass manufactured by Corning Co., Ltd. is generally known as a heat-resistant glass. In the present embodiment, pipe 1020 having total length L of 150 mm and having inner diameter d1 and outer diameter d2 of 1.8 mm and 3 mm, respectively, was used.

Next, one end of pipe 1020 of FIG. 7(a) is heated by a burner and softened to close the end (See the broken line part of FIG. 7(b)).

Thereafter, the inside of pipe 1020 is loaded with a powder of thermoelectric conversion material 101 subjected to pulverization or made into a fine chip through the other end opposite to the closed end. Thermoelectric conversion material 101 is crushed and adjusted to have a dimension capable of loading the inside space of pipe 1020 after the composition is adjusted in advance. In the present embodiment, thermoelectric conversion material 101 is set to be a $Bi_2Te_3$ series material.

Also, the inside of pipe 1020 was loaded with thermoelectric conversion material 101 by putting the material into the pipe 1020 through a funnel-shaped tube 103 mounted at an opening part of pipe 1020 (the other end opposite to the closed one end) while applying a fine vibration to pipe 1020 and/or funnel-shaped tube 103, as shown in FIG. 7(c). In the present embodiment, pipe 1020 is loaded with thermoelectric conversion material 101 up to about half of tube 1020 as shown in FIG. 7(c).

Then, referring to FIG. 7(d), the other end of pipe 1020 is connected to vacuum pump 104, and then the pressure in the inside of pipe 1020 is reduced. And further, the other end of pipe 1020 is heated by a burner and softened to close the other end (See the broken line part of FIG. 7(e)). Thereafter, pipe 1020 loaded with thermoelectric conversion material 101 is put into a heating furnace (not illustrated in the drawings). At this time, pipe 1020 is put into the heating furnace in a state of vertically standing with one end facing downwards and the other end facing upwards. The temperature in the heating furnace is raised to about 700 degrees Celsius, and such a state was maintained for about 30 minutes (FIG. 7(f)). In the state of FIG. 7(f), thermoelectric conversion material 101 in pipe 1020 is liquefied (melted) so as to sediment down to the lower part of pipe 1020. As just described, by putting pipe 1020 loaded with thermoelectric conversion material 101 in the heating furnace, it is possible to realize a thermoelectric conversion material 101 filled in a lower part of the inside of pipe 1020.

Here, since thermoelectric conversion material 101 will be reduced in volume after being melted, the space that is not filled with thermoelectric conversion material 101 will be larger in the inside of pipe 1020 whose two ends are closed. Pipe 1020 preferably has buffer section 105 before melting thermoelectric conversion material 101. Buffer section 105 is for a space having a size capable of sufficiently adsorbing such a fluctuation of the space. When a suitable buffer section 105 is provided, pipe 1020 is prevented from being split by thermal stress generated by the temperature of pipe 1020.

Thereafter, pipe 1020 the lower part of which is filled with thermoelectric conversion material 101 is cooled by bring pipe 1020 out from the heating furnace or by reducing temperature in the heating furnace. Next, referring to FIG. 7(g), heater 106 is placed on the outside of pipe 1020, and heater 106 is moved from the lower part (one end) of pipe 1020 towards the upper part (the other end) so as to move the heating region at a constant rate, whereby thermoelectric conversion material 101 is solidified in one direction. The moving rate of heater 106 is preferably about 25 to 30 mm/h. As described above, the reason why thermoelectric conversion material 101 is heated again by heater 106 is fro aligning the crystal orientation of thermoelectric conversion material 101 in one direction.

Here, "alignment of crystal orientation" in thermoelectric conversion material 101 means that the a-axis of the crystal of material 101 is within 30% with respect to the direction from one end to the other end of thermoelectric conversion material 101 (that is, the axis of tube 2), which is measured by the crystal orientation analysis. Also, "alignment of crystal orientation of the material 101 in one direction" means that 60% or more of all a-axes of the crystals of materials 101 to be analyzed are within 30% with respect to the axis of tube 2.

Then, as shown in FIG. 7(h), pipe 1020 filled with thermoelectric conversion material 101 whose crystal orientation has been aligned in one direction is cut in a direction perpendicular to the longitudinal direction of pipe 1020 by wire saw 107, together with the solidified thermoelectric conversion material 101 filled in the pipe 102. When a surface roughness Ra of the cut surface is out of a desired range (for example, a range larger than 0.8 micrometers and smaller than or equal to 4.5 micrometers, or a specific range within it), Ra of the cut surface is adjusted by using a polishing material such as a file. Also, Ra of the cut surface tends to decrease, for example, by decreasing the cutting rate of cutting means such as a wire saw, and may increase by increasing the cutting rate. By such a cutting rate, Ra of the cut surface may be adjusted. In this manner, thermoelectric conversion material 101 filled in tube 102 (namely, thermoelectric conversion member 100) can be obtained (FIG. 7(i)).

By the process of manufacturing a thermoelectric conversion member described above, thermoelectric conversion material 101 can be disposed in close adhesion to the inside surface of tube 102. By this configuration, it is possible to restrain "breakage" or "cracks" that can be generated upon cutting thermoelectric conversion material 101, so that a thermoelectric conversion element having a high reliability can be provided. Also, since tube 102 itself can perform a role as a spacer in an assembly in which a plurality of thermoelectric conversion members 100 are arranged, it is possible to arrange the thermoelectric conversion elements at high-density.

Here, the present embodiment has been shown in which the thermoelectric conversion member is manufactured by using one pipe 1020; however, the thermoelectric conversion member may be manufactured by simultaneously using a plurality of pipes 1020.

Figure 8:
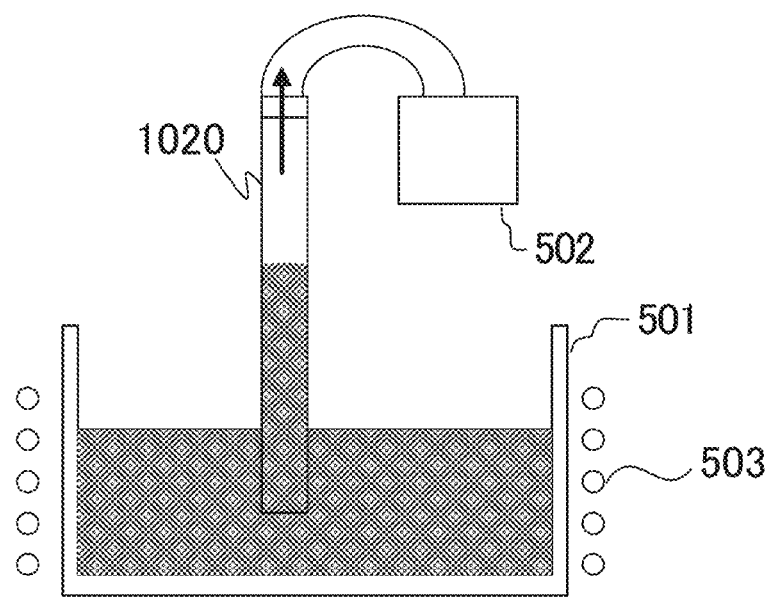
FIG. 8 is a view schematically showing another example of a process for manufacturing the thermoelectric conversion member of FIG. 6.

Also, in the above-described embodiment, a step of raising the temperature of thermoelectric conversion material 101 filled in the inside of pipe 1020 in a heating furnace (FIG. 7(f)) and thereafter heating/solidifying thermoelectric conversion material 101 again by heater 106 (FIG. 7(g)) has been shown; alternatively, thermoelectric conversion member 100 can be manufactured as shown in FIG. 8, for example.

In this embodiment, the inside of pipe 1020 is filled with thermoelectric conversion material 101 by: storing a thermoelectric conversion material fused at about 700 degrees Celsius in tank 501 having heater 503; immersing one end of pipe 1020 into the fused thermoelectric conversion material in tank 501; and sucking the thermoelectric conversion material up into pipe 1020 by pump 502 connected to the other end of pipe 1020.

When pipe 1020 is filled with thermoelectric conversion material 101 by this method, the crystal orientation of thermoelectric conversion material 101 is aligned in one direction when the fused thermoelectric conversion material moves through the inside of pipe 1020, thereby giving an advantage of eliminating the step shown in FIG. 7(g) from production process.

An electrode is formed on thermoelectric conversion member 100 shown in FIG. 7(i). The electrode may be independently formed on each thermoelectric conversion member 100, or alternatively, the electrode may be formed so as to connect a plurality of thermoelectric conversion members 100 integrally with one another electrically. The electrode may be formed, for example, by vapor deposition of metal, sputtering, or thermal spraying. The material of the electrode preferably has a sufficient close adhesion property to both of the thermoelectric conversion member and the tube described above. For example, when the thermoelectric conversion member is a bismuth•tellurium series and the tube is a heat-resistant glass, a preferred example of the material of the electrode includes an alloy containing two or more of Bi, Cu, Sb, and In.

When the electrode is formed integrally on a plurality of thermoelectric conversion members 100, thermoelectric conversion members 100 shown in FIG. 7(i) are arranged alternately in parallel, for example.

Figure 9A:
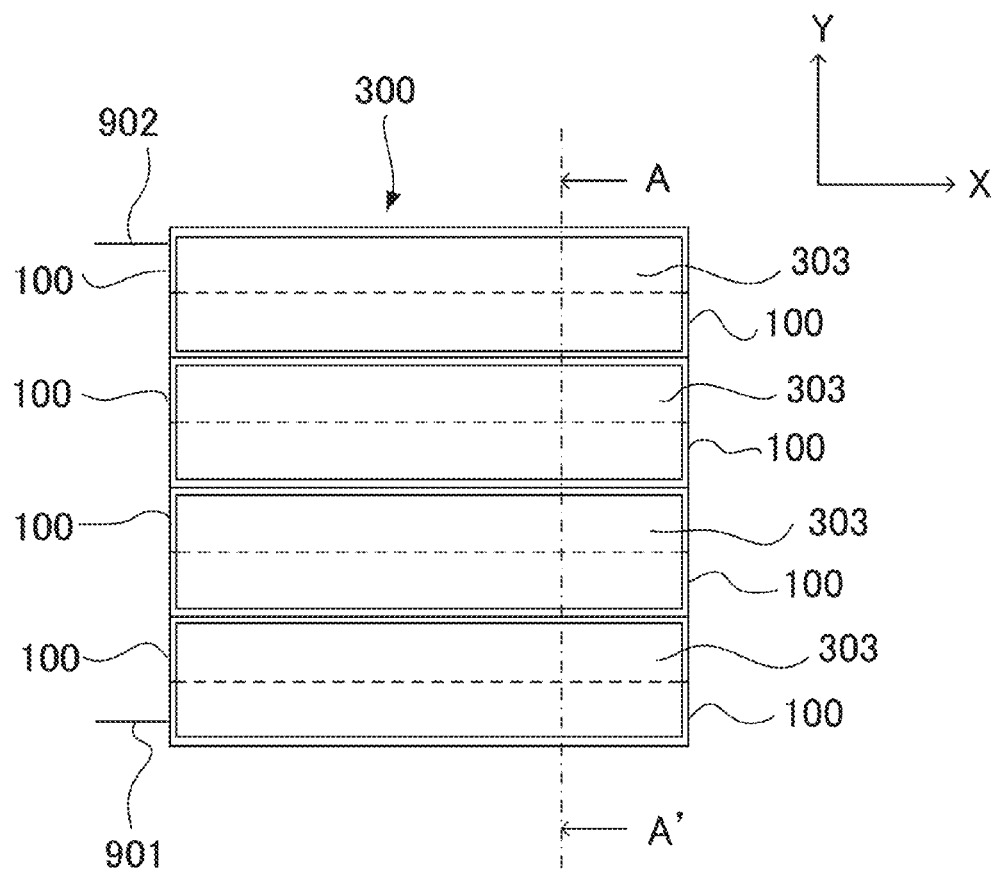
FIG. 9 is a view schematically showing one example of a thermoelectric conversion element module obtained by using the thermoelectric conversion member of FIG. 6.
Figure 9B:
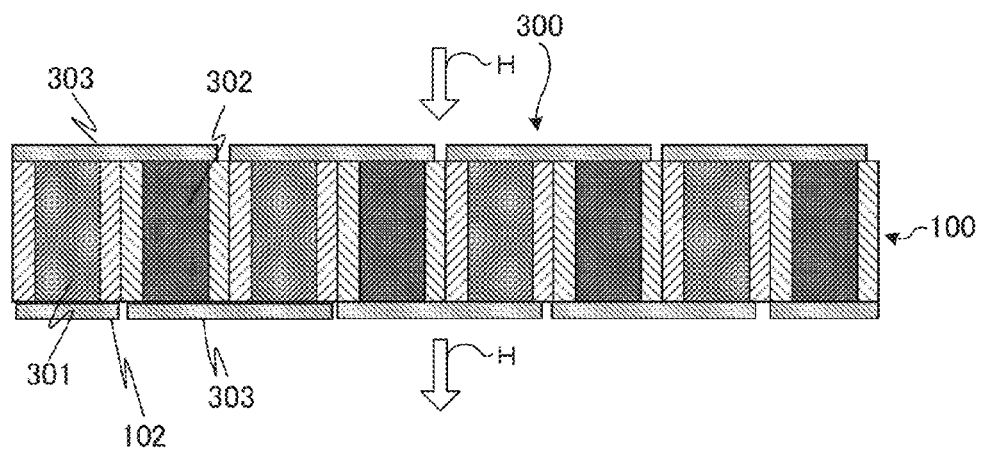

FIGS. 9A and 9B are a model view of thermoelectric conversion element module 300 according to one embodiment of the present invention.

Thermoelectric conversion element module 300 shown in FIG. 9A is obtained by assembling a plurality of thermoelectric conversion members 100 shown in the above-described embodiment and electrically connecting thermoelectric conversion members 100 with one another. FIG. 9B shows a cross-section of thermoelectric conversion element module 300 along the A-A' line in FIG. 9A.

In FIGS. 9A and 9B, reference numerals 301 and 302 denote a p-type thermoelectric conversion material and an n-type thermoelectric conversion material, respectively, and reference numeral 303 denotes a connection electrode that electrically and integrally connects p-type thermoelectric conversion material 301 and n-type thermoelectric conversion material 302. Tube 102 covers the thermoelectric conversion materials. P-type thermoelectric conversion material 301 and n-type thermoelectric conversion material 302 are electrically connected by connection electrode 303 at the upper end and the lower end of each. Also, reference numerals 901 and 902 denote leading wires that respectively connect to the two terminal ends of connection electrodes 303 in which the p-type thermoelectric conversion member group and n-type thermoelectric conversion member group are electrically connected in series.

Thermoelectric conversion member 100 having p-type thermoelectric conversion material 301 and thermoelectric conversion member 100 having n-type thermoelectric conversion material 302 are alternately arranged in one direction and in parallel. Connection electrode 303 integrally connects thermoelectric conversion member 100 having p-type thermoelectric conversion material 301 and thermoelectric conversion member 100 having n-type thermoelectric conversion material 302 at one end side or at the other end side of the elements, the members 100 being adjacent to each other. Thereby, the all of the arranged p-type thermoelectric conversion member 100 and n-type thermoelectric conversion member 100 are electrically connected in series. Electricity can be generated by supplying heat to a thermoelectric conversion element module having such a construction from one end side in each element as shown by arrow H in FIG. 9B.

Connection electrode 303 in thermoelectric conversion element module 300 is in close adhesion to both of the end surfaces of p-type thermoelectric conversion material 301 or n-type thermoelectric conversion material 302 and the end surface of tube 102. For this configuration, in the case of connecting a plurality of thermoelectric conversion members 100 directly by an electrode, the heat stress generated by contacting with a high-temperature part can be received with a larger area than that of a conventional thermoelectric conversion element. Therefore, the stress is relived and a reliability of connection between the thermoelectric conversion member and the electrode can be improved.

Hereinafter, with reference to FIG. 10, a method of manufacturing thermoelectric conversion element module 300 in which a plurality of thermoelectric conversion members 100 are arranged in a zigzag manner, for example, will be described.

Referring to FIG. 10(a), first, Teflon (registered trademark) resin 401 is prepared. Teflon (registered trademark) resin 401 will be a base material of thermoelectric conversion element module 300. Next, after heat-resistant adhesive agent 402 is applied onto a surface of Teflon (registered trademark) resin 401 (FIG. 10(b)). Teflon (registered trademark) block 403 for positioning is disposed on one end side of Teflon (registered trademark) resin 401 as shown in FIG. 10(c). Thereby, pipes 1020 (hereafter also referred to as "p-type pipe" or "n-type pipe") filled with the p-type or n-type thermoelectric conversion materials, the pipes being manufactured through the process shown in FIG. 7 and FIG. 8, are arranged in parallel so as to be adjacent to each other. Further, as shown in FIG. 10(d), heat-resistant adhesive agent 402 is applied to cover the surface of p-type or n-type pipes 1020 arranged in FIG. 10(c). And then, an array consisting of p-type or n-type pipes 1020 are further stacked over the p-type or n-type pipes 1020 on which heat-resistant adhesive agent 402 has been applied (FIG. 10(e)). For example, when pipes 1020 arranged in FIG. 10(c) are p-type pipes, pipes 1020 stacked adjacently thereon will be n-type pipes.

Figure 10:
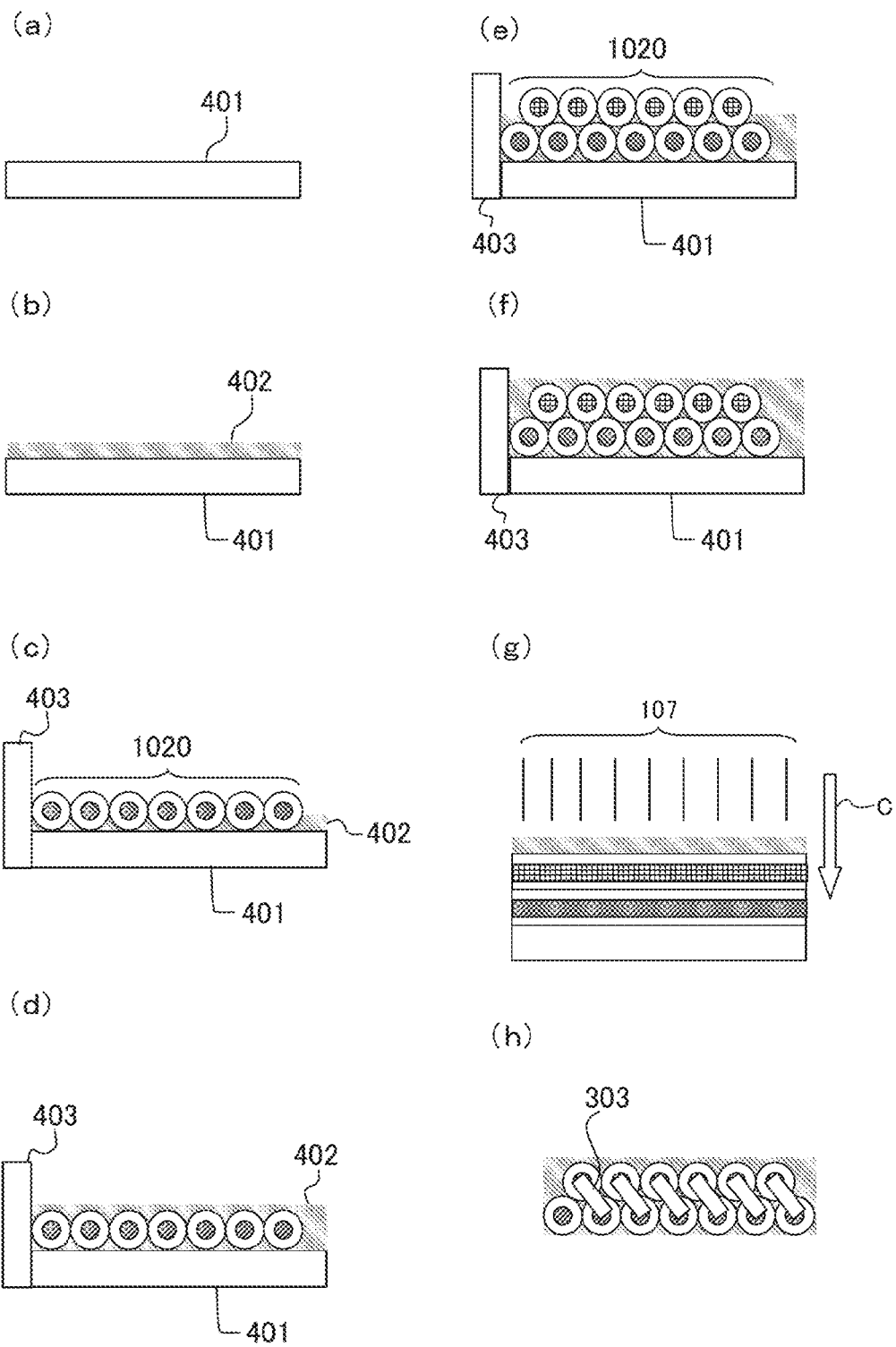
FIG. 10 is a view schematically showing a process for manufacturing a thermoelectric conversion element module made of a thermoelectric conversion member group.

Again, heat-resistant adhesive agent 402 is applied onto pipes 1020 (FIG. 10(f)), and stacking of pipes 1020 and applying of heat-resistant adhesive agent 402 are alternately repeated to stack plural layers of pipes 1020. In particular, in FIG. 10, a construction is shown in which two layers of pipes 1020 are arranged; however, typically two or more plural layers are stacked in many cases. As an arrangement of pipes 1020, a structure having a zigzag manner is provided by stacking pipes 1020 being the upper layer onto pipes 1020 being the lower layer, so as to be in contact at two points. Of course, a structure having a lattice manner can be provided by stacking pipes 1020 being the upper layer onto pipes 1020 being the lower layer at a position immediately above pipes 1020 of the lower stage. A structure having a lattice manner may sometimes be more liable to cause positional shift of individual thermoelectric conversion members as compared with a structure having a zigzag shape.

After stacking a plurality of predetermined pipes 1020, heat-resistant adhesive agent 402 is cured to integrate the stacked heat-resistant insulating material pipes 1020. And then Teflon (registered trademark) block 403 for positioning is removed. Pipes 1020 are cut to a predetermined thickness by wire saw 107 in a direction (cutting direction C in the Figure) perpendicular to the longitudinal direction of pipes 1020 (FIG. 10(g)). The cutting direction is a direction perpendicular to the plane direction in FIG. 10(g). Then, a material of connection electrode 303, for example, is plated on the end surfaces of the thermoelectric conversion member group constituting the module, so as to form a metal layer up to a predetermined thickness. Thereupon, connection electrode 303 having a planar shape is formed by etching (FIG. 10(h)) so as to connect the p-type and n-type alternately Although the back surface is not illustrated in FIG. 10, connection electrode 303 is formed so that p-type and n-type may be alternately connected in series in the same manner as in FIG. 10(h). In this manner, a thermoelectric conversion element module is formed.

Figure 11:
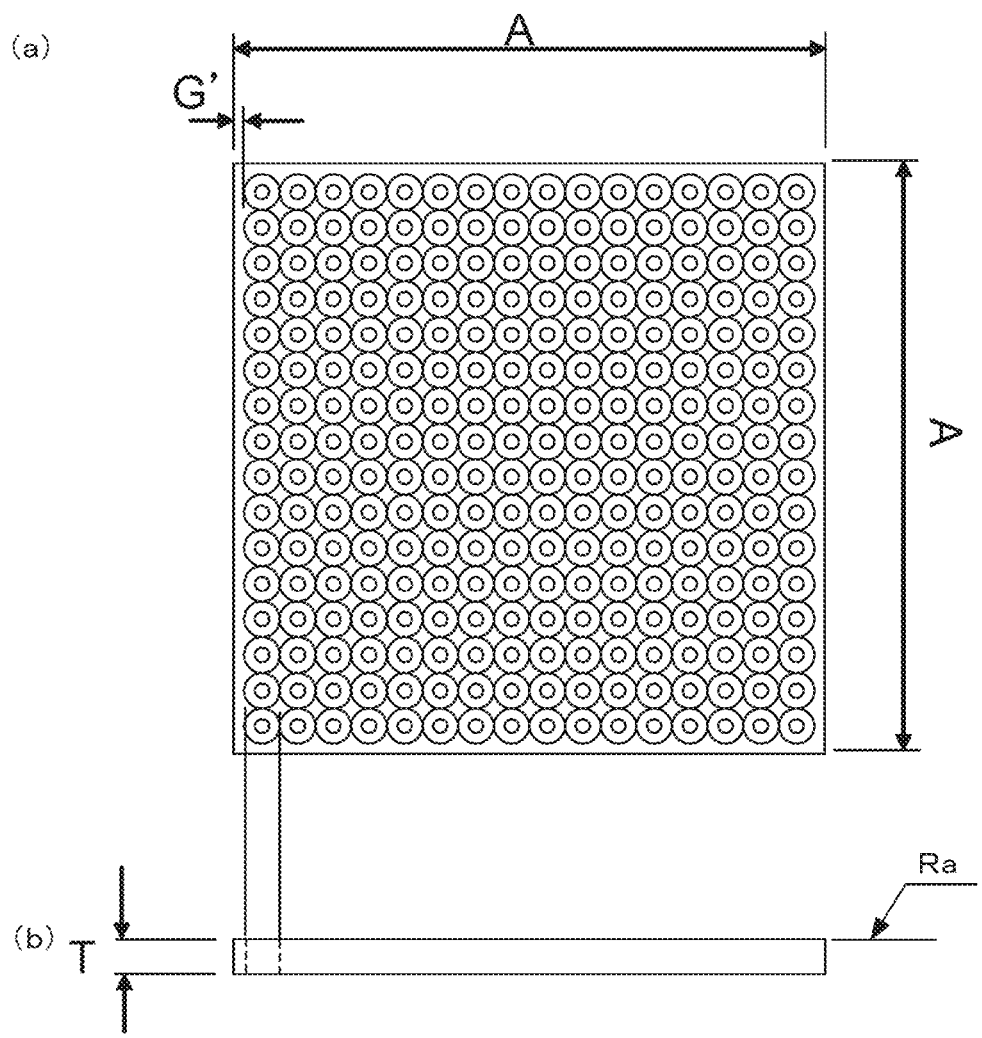
FIG. 11 is a view schematically showing the whole image of one example of a thermoelectric conversion element group.

FIGS. 11(a) and 11(b) show a thermoelectric conversion member group in which thermoelectric conversion members are arranged in a lattice shape. FIG. 11(a) is a plan view of one example of a thermoelectric conversion member group, and FIG. 11(b) is a side view of the one example of the thermoelectric conversion member group. In this thermoelectric conversion member group, the number of the thermoelectric conversion members arranged in the longitudinal direction and the number of the thermoelectric conversion members arranged in the lateral direction is same. When the number of thermoelectric conversion members is 16×16, the dimension (A×A) of the thermoelectric conversion member group including the gap G' (1 mm) at each side of the lattice shape is 50 mm×50 mm; when the number of thermoelectric conversion member groups is 8×8, the dimension of the member group is 26 mm×26 mm; and when the number of thermoelectric conversion member groups is 4×4, the dimension of the member group is 14 mm×14 mm. Also, the thickness T of the member group corresponds to the length of the thermoelectric conversion member and is, for example, 3 mm. Also, the surface roughness Ra of a surface of the member group is, for example, 4.5 micrometers.

Figure 12A:
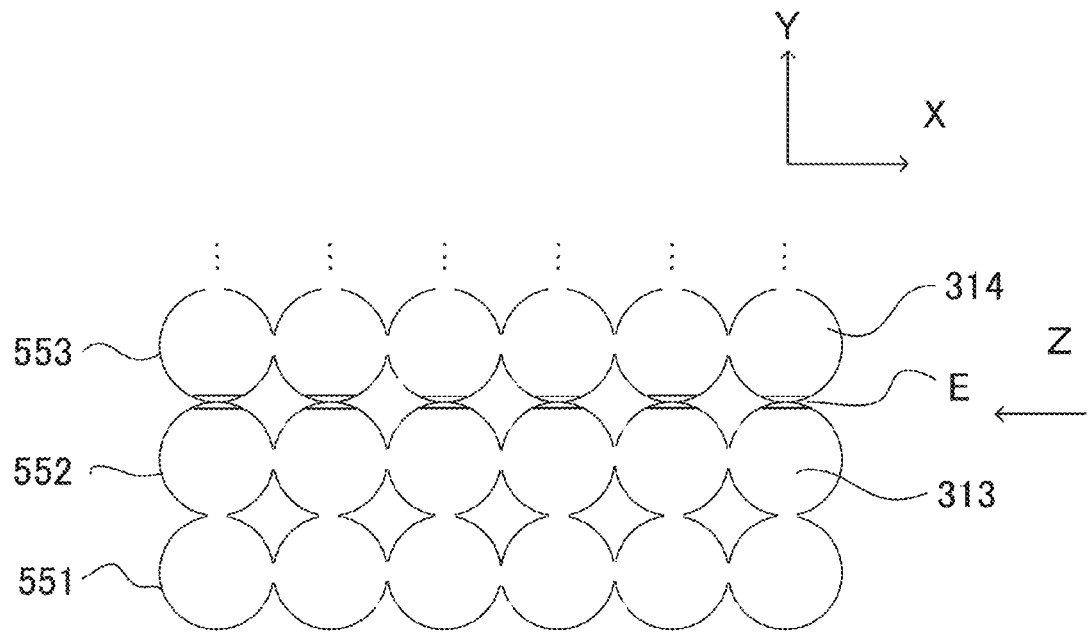
FIG. 12 is a view schematically showing one example of a thermoelectric conversion element module in which thermoelectric conversion members of a thermoelectric conversion member group are electrically connected by a single electrode.
Figure 12B:
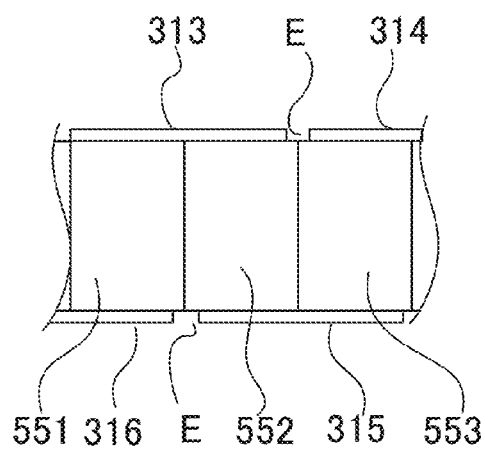

Further, in the thermoelectric conversion element module, the electrode may be formed for each of the thermoelectric conversion member groups. For example, the thermoelectric conversion element module shown in FIG. 12A is a thermoelectric conversion element module of a lattice-shaped structure having: a first p-type thermoelectric conversion member group in which a plurality of p-type thermoelectric conversion members 551 are arranged in parallel in one row in the X-direction; a first n-type thermoelectric conversion member group in which a plurality of n-type thermoelectric conversion members 552 are arranged in parallel in one row in the X-direction; and a second p-type thermoelectric conversion member group in which a plurality of p-type thermoelectric conversion members 553 are arranged in parallel in one row in the X-direction. And also, the p-type and n-type thermoelectric conversion members 551, 552, 553 in each element group are also arranged in parallel in one row in the Y-direction. Here, FIG. 12A is a plan view of an essential part of one example of the thermoelectric conversion element module according to the present invention, and FIG. 12B is a side view of the essential part when the one example of the thermoelectric conversion element module is seen in the arrow Z direction.

This thermoelectric conversion element module has: electrode 313 that is in close adhesion to one end surfaces of the members constituting the first p-type thermoelectric conversion member group and one end surfaces of the members constituting the first n-type thermoelectric conversion member group; and electrode 314 that is in close adhesion to one end surfaces of the members constituting the second p-type thermoelectric conversion member group and one end surfaces of the members constituting the second n-type thermoelectric conversion member group (not shown). The second n-type thermoelectric conversion member group is adjacent to the second n-type thermoelectric conversion member group. Further, as shown in FIG. 12B, this thermoelectric conversion element module has: electrode 315 that is in close adhesion to the other end surfaces of the members constituting the first n-type thermoelectric conversion member group and the other end surfaces of the members constituting the second p-type thermoelectric conversion member group; and electrode 316 that is in close adhesion to the other end surfaces of the members constituting the first p-type thermoelectric conversion member group and the other end surfaces of the members constituting the an n-type thermoelectric conversion member group (not illustrated), which is adjacent the first p-type thermoelectric conversion member group. Grooves E formed by etching is arranged between electrodes 313 and 314 and between electrodes 315 and 316, which are adjacent to each other on each end surface side of FIG. 12A and FIG. 12B.

Electrodes 313 to 316 can be formed by etching to remove a part of the metal layer formed in the whole region of both end surfaces of the thermoelectric conversion member groups in which the thermoelectric conversion members are arranged in the lattice-manner. Thereby, the same electrode can connect arbitrary member groups to each other. In this manner, when the p-type element group and the n-type element group are electrically connected by one electrode, an element group that behaves like one large element can be constructed from a plurality of small elements. As a result of this, an energy saving in forming the electrode can be achieved, and also an increase of the electromotive force by thermoelectric conversion can be expected.

Here, in the present embodiment in particular, a mode of a thermoelectric conversion element module has been shown in which n-type or p-type pipes 1020 are stacked alternately and row by row on p-type or n-type pipes 1020 arranged in a row; however, a mode of the thermoelectric conversion element module in the present invention is not limited to the mode. For example, the p-type thermoelectric conversion members and the n-type thermoelectric conversion members are alternately arranged in an arrangement of one stacked row. Alternatively, a p-type thermoelectric conversion member group and an n-type thermoelectric conversion member group are alternately stacked, the p-type thermoelectric conversion member group obtained by stacking plural rows of p-type thermoelectric conversion members, and the n-type thermoelectric conversion member group obtained by stacking plural rows of n-type thermoelectric conversion members. In this manner, various arrangements can be conceived as an arrangement of thermoelectric conversion members in a thermoelectric conversion element module.

Figure 13A:
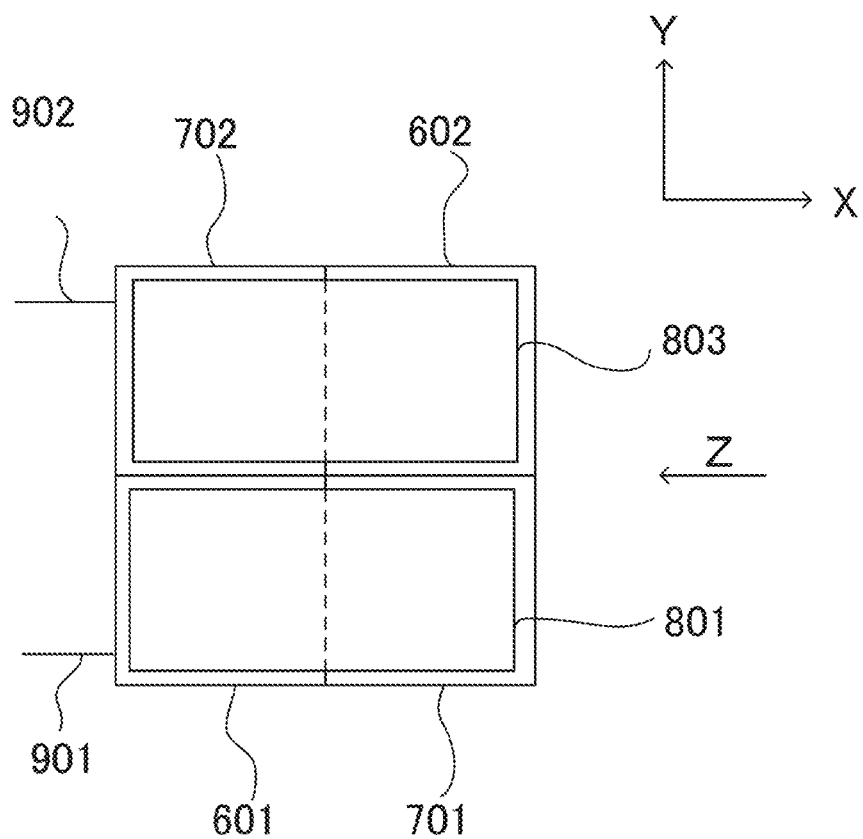
FIG. 13 is a view schematically showing one example of a thermoelectric conversion element module having electrodes which connect each of the thermoelectric conversion member groups.
Figure 13B:
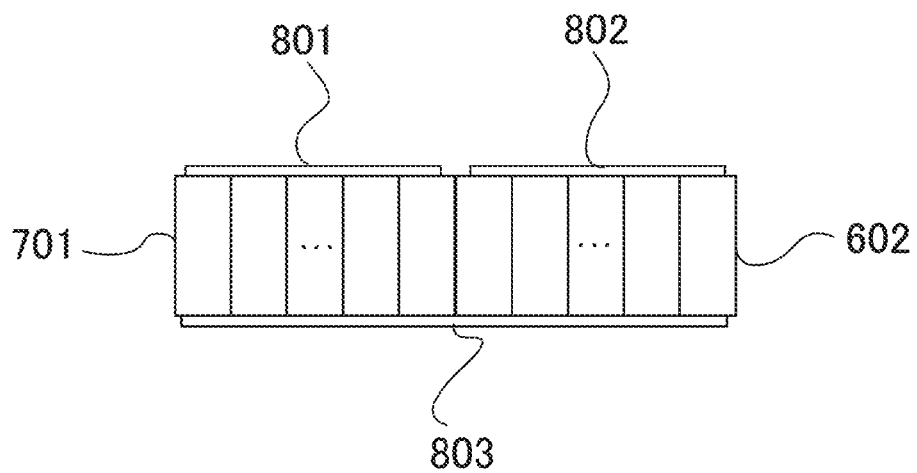

FIG. 13A is a plan view showing another example of a thermoelectric conversion element module according to the present invention, and FIG. 13B is a side view when another example of the thermoelectric conversion element module is seen in the arrow Z direction. For example, the thermoelectric conversion element module shown in FIGS. 13A and 11B has: p-type thermoelectric conversion member group 601; n-type thermoelectric conversion member group 701 adjacent to p-type thermoelectric conversion member group 601 in the X-direction; p-type thermoelectric conversion member group 602 adjacent to n-type thermoelectric conversion member group 701 in the Y-direction; and n-type thermoelectric conversion member group 702 adjacent to p-type thermoelectric conversion member group 602 in the X-direction and to p-type thermoelectric conversion member group 601 in the Y-direction.

Also, the thermoelectric conversion element module shown in FIGS. 13A and 13B has, at one end side of each element, electrode 801 that electrically connects to the members constituting p-type thermoelectric conversion member group 601 and the members constituting n-type thermoelectric conversion member group 701, and electrode 803 that electrically connects to the members constituting p-type thermoelectric conversion member group 602 and the members constituting n-type thermoelectric conversion member group 702.

Further, the thermoelectric conversion element module shown in FIGS. 13A and 13B has, at the other end side of each element, electrode 802 that electrically connects to the members constituting n-type thermoelectric conversion member group 701 and the members constituting p-type thermoelectric conversion member group 602, an electrode not illustrated that electrically connects to the members constituting p-type thermoelectric conversion member group 601, an electrode not illustrated that electrically connects to the members constituting n-type thermoelectric conversion member group 702, a leading wire 901 connected to an electrode on the other end side of p-type thermoelectric conversion member group 601, and a leading wire 902 connected to an electrode on the other end side of n-type thermoelectric conversion member group 702. Each thermoelectric conversion member group has, for example, a structure having a lattice shape of n pieces×n pieces. In this manner, the thermoelectric conversion element module may assume a mode comprising an n-type thermoelectric conversion member group and p-type thermoelectric conversion member group. The n-type thermoelectric conversion member group is composed of n-type thermoelectric conversion members in parallel to each other so as to have a predetermined shape. The p-type thermoelectric conversion member group is composed of p-type thermoelectric conversion members in parallel to each other so as to have a predetermined shape.

Figure 14A:
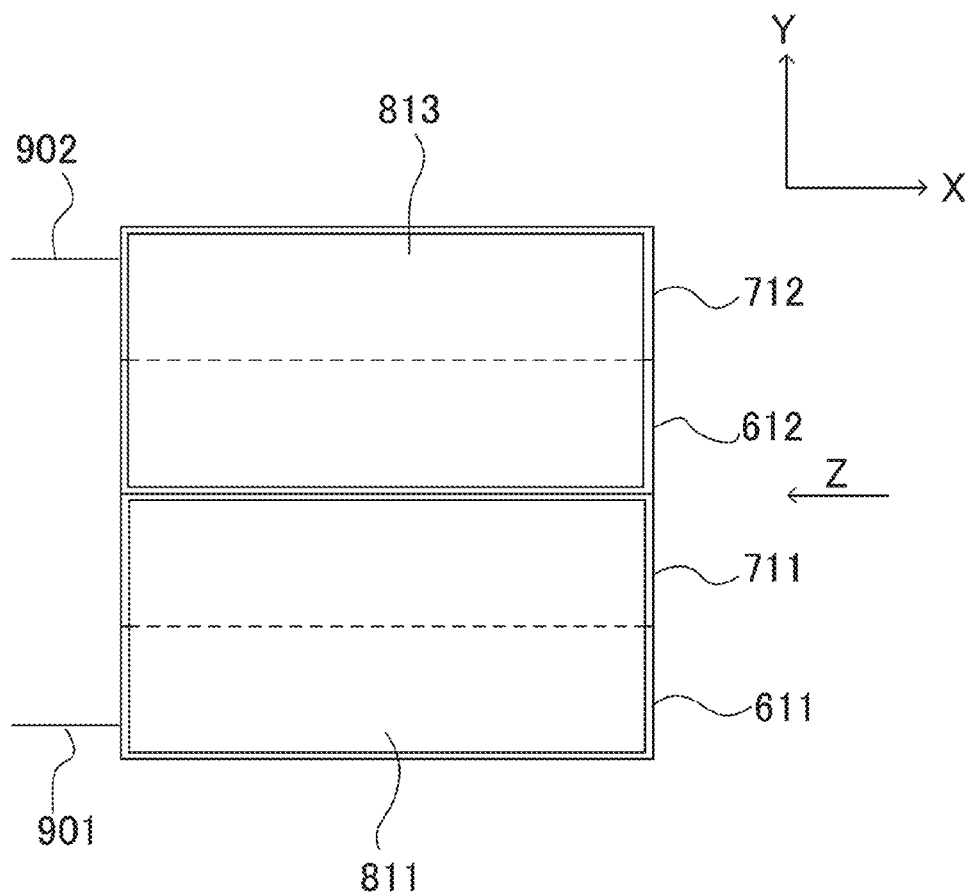
FIG. 14 is a view schematically showing another example of a thermoelectric conversion element module having electrodes which connect each of the thermoelectric conversion member groups.
Figure 14B:
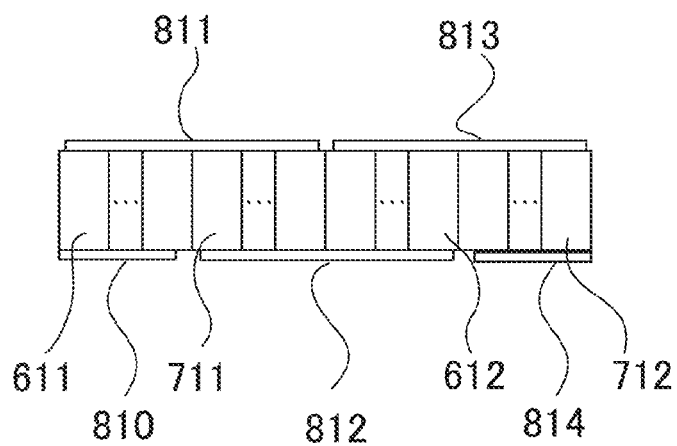

FIG. 14A is a plan view showing still another example of a thermoelectric conversion element module according to the present invention, and FIG. 14B is a side view when the still another example of the thermoelectric conversion element module is seen in the arrow Z direction. The thermoelectric conversion element module shown in FIGS. 14A and 14B has: p-type thermoelectric conversion member group 611; n-type thermoelectric conversion member group 711 adjacent to p-type thermoelectric conversion member group 611 in the Y-direction; p-type thermoelectric conversion member group 612 adjacent to n-type thermoelectric conversion member group 711 in the Y-direction; and n-type thermoelectric conversion member group 712 adjacent to p-type thermoelectric conversion member group 612 in the Y-direction.

Also, the thermoelectric conversion element module shown in FIGS. 14A and 14B has, at one end side of each element, electrode 811 that electrically connects to the members constituting p-type thermoelectric conversion member group 611 and the members constituting n-type thermoelectric conversion member group 711, and electrode 813 that electrically connects to the members constituting p-type thermoelectric conversion member group 612 and the members constituting n-type thermoelectric conversion member group 712.

Further, the thermoelectric conversion element module shown in FIGS. 14A and 14B has, at the other end side of each element, electrode 810 that electrically connects to the members constituting p-type thermoelectric conversion member group 611, electrode 812 that electrically connects to the members constituting n-type thermoelectric conversion member group 711 and the members constituting p-type thermoelectric conversion member group 612, electrode 814 that electrically connects to the members constituting n-type thermoelectric conversion member group 712, a leading wire 901 connected to electrode 810, and a leading wire 902 connected to electrode 814. Each thermoelectric conversion member group has, for example, a structure having a lattice manner of m pieces×n pieces. In this manner, the thermoelectric conversion element module may assume a mode comprising a p-type thermoelectric conversion member group and an n-type thermoelectric conversion member group. The p-type thermoelectric conversion member group is composed of p-type thermoelectric conversion members in parallel to have a predetermined shape. The n-type thermoelectric conversion member group is composed of n-type thermoelectric conversion members in parallel to have a predetermined shape.

In the present invention, in manufacturing a module by repeating stacking and bonding p-type and n-type pipes 1020, a dummy pipe that does not filled with the thermoelectric conversion material is preferably disposed at least at the uppermost stage. The dummy pipe is formed only of the tube made of the heat-resistant insulating material. A material of the dummy pipe is preferably the same as that of pipe 1020 in view of the productivity of the thermoelectric conversion element module.

Figure 15A:
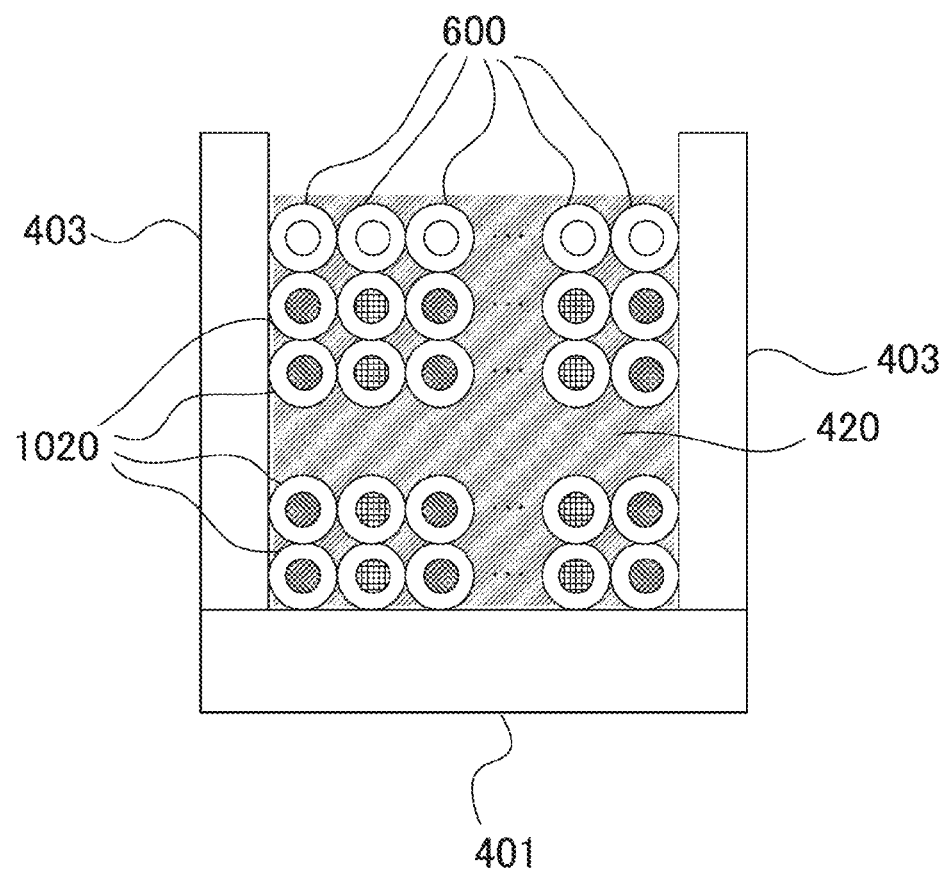
FIG. 15 is a view schematically showing an essential part of a step for manufacturing a thermoelectric conversion element module using dummy pipes.
Figure 15B:
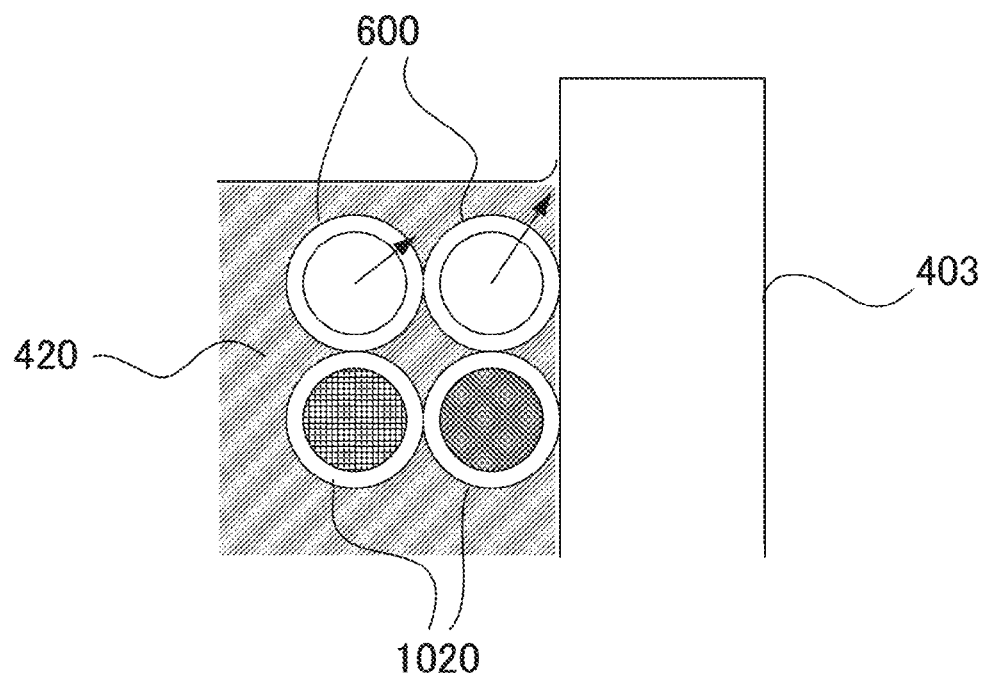

FIG. 15A is a view schematically showing one process of manufacturing a thermoelectric conversion element module, and FIG. 15B is an enlarged view of the essential part of a product of the one manufacturing process. Referring to FIG. 15A, a row of dummy pipes 600 is arranged on the uppermost part of the assembly in which rows of p-type pipes 1020 and rows of n-type pipes 1020 are alternately stacked via layers of heat-resistant adhesive agent 420. And further heat-resistant adhesive agent 420 is applied to the row of dummy pipes 600. Dummy pipe 600 is, for example, a pipe made of heat-resistant glass used in pipe 1020.

Heat-resistant adhesive agent 420 applied to the row of dummy pipes 600 is liable to be dried starting from an end part. Therefore, heat-resistant adhesive agent 420 easy to flow towards the end of the application surface, for example, towards the contact surface of positioning block 403 with heat-resistant adhesive agent 420. For this reason, heat-resistant adhesive agent 420 is subjected to a force which is directed towards the end of the application surface. As a result, the pipes on the uppermost stage are pulled towards the end (See the arrow symbol in FIG. 15B). In a case where p-type or n-type pipes 1020 are pulled, a disturbance may be generated in the arrangement of the elements in the thermoelectric conversion element group, thereby possibly inviting an obstacle against suitably forming the electrode.

On the other hand, when dummy pipes 600 are arranged on the uppermost stage as shown in FIGS. 15A and 15B, if dummy pipes 600 are pulled by force of heat-resistant adhesive agent 420 during the drying step, the force of heat-resistant adhesive agent 420 hard to influence p-type and n-type tubes 102 arranged under dummy pipes 600. Therefore, a desired arrangement of element groups can be maintained.

In the illustrated mode, a mode has been shown in which one row of dummy pipes 600 are arranged on the uppermost stage; however, two or more rows of dummy pipes 600 may be arranged on the uppermost stage. And also, pipes 1020 that are in contact with one or both of positioning blocks 403 (see FIG. 15A) can be substituted with dummy pipes 600 so that the assembly composed of the p-type group and n-type group may be surrounded. Alternatively, pipes 1020 that are in contact with base material 401 (see FIG. 15A) can be substituted with dummy pipes 600.

Figure 16A:
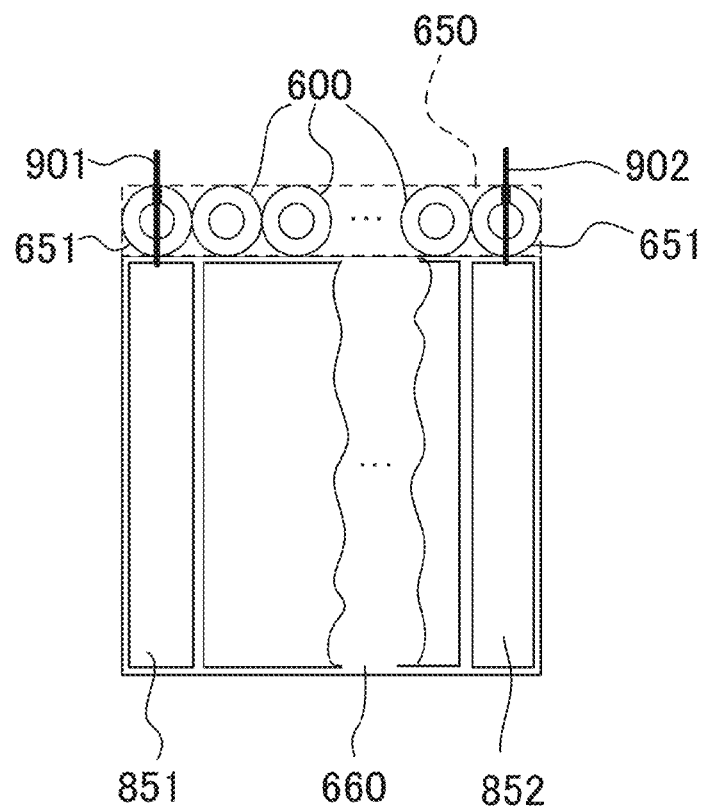
FIG. 16 is a view schematically showing one example of a thermoelectric conversion element module having a dummy region.

A thermoelectric conversion element module shown in FIG. 16A has p-type thermoelectric conversion member group 660 and n-type thermoelectric conversion member group 660, dummy region 650 in which dummy pipes 600 are arranged, dummy region 650 being adjacent to thermoelectric conversion member groups 660, electrodes 851 and 852 formed on both sides of one end surface of thermoelectric conversion member groups 660, and leading wires 901 and 902 that are respectively connected to electrodes 851 and 852 through dummy region 650. Electrodes 851 and 852 are respectively the electrodes at the two terminal ends of the module in which the elements of p-type thermoelectric conversion member group 105 and n-type thermoelectric conversion member group 105 are electrically connected in series. Here, FIG. 16A is a plan view of one example of a thermoelectric conversion element module having a dummy region according to the present invention, and FIG. 16B is a perspective view of the thermoelectric conversion element module.

Figure 16B:
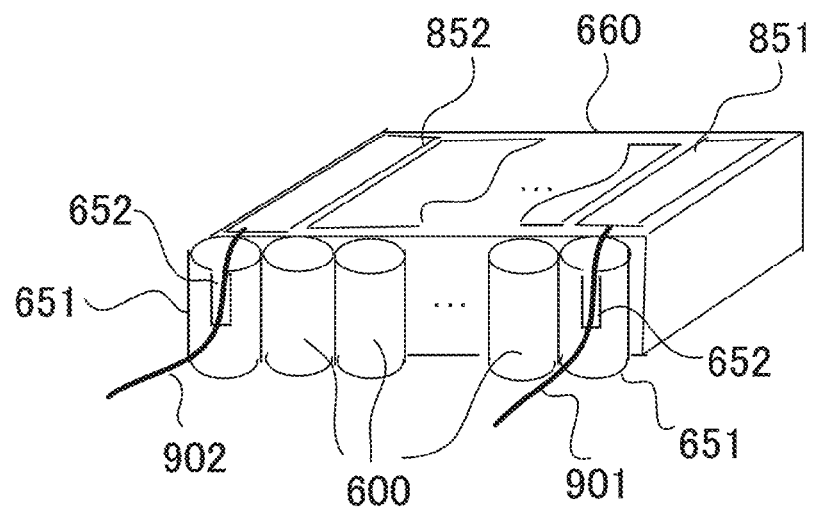
Figure 17:
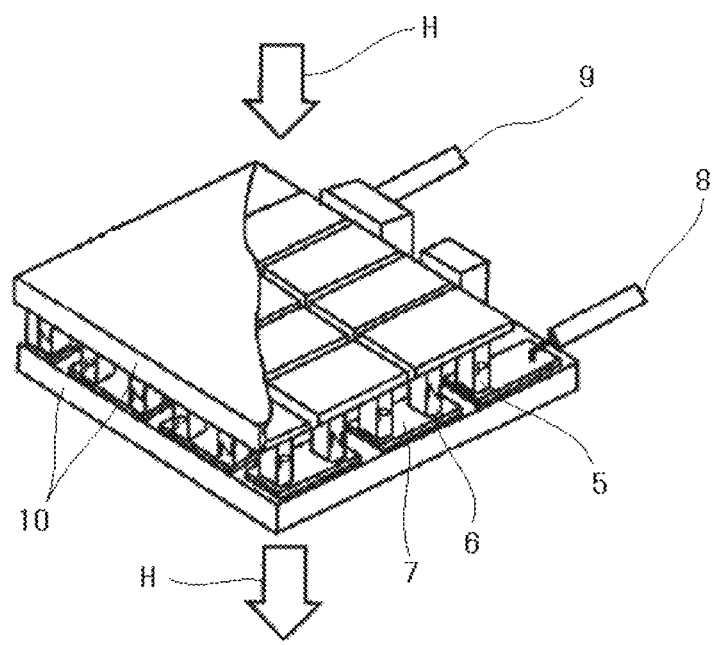
FIG. 17 is a model view showing a conventional thermoelectric conversion element module.

Referring to FIG. 16B, dummy pipes 651 near electrodes 851 and 852 respectively have slits 652 that are open from one end to the central part of the pipes to face the outside of the module. Leading wires 901 and 902 respectively extend to the outside through slits 652 via dummy pipes 651. In this manner, a thermoelectric conversion element module having dummy region 650 can guide the leading wires to the outside, and cam set the leading wires away from the electrodes. It is preferable in view of preventing breakage of the leading wires by heat during the use of the thermoelectric conversion element module.

By a process of manufacturing the thermoelectric conversion element module described above, a heat-resistant insulating layer having a connection electrode is formed between the thermoelectric conversion elements, so that a heat stress generated by the temperature difference between a high temperature and a low temperature can be alleviated. For this reason, it is possible to realize a thermoelectric conversion element module structure capable of improving the reliability against the heat stress.

(Experiment of Evaluating Breakage Strength by Surface Roughness)

Connection strength between a thermoelectric conversion member and an electrode was measured when the surface roughness Ra of the end surface of the thermoelectric conversion member was changed. As the thermoelectric conversion material, $Bi_{0.5}Sb_{1.5}Te_3$ was used. Each of the thermoelectric conversion materials was melted and sucked up into a heat-resistant glass (outer diameter: 3.0 mm, inner diameter: 1.8 mm), which was then cut to a length of 10 mm to manufacture a thermoelectric conversion member. The end surface of the thermoelectric conversion member was polished with a file in accordance with the needs, thereby obtaining thermoelectric conversion members having different surface roughness of the end surface of the thermoelectric conversion material. The surface roughness Ra was measured by using a step difference meter (Tencor P-10).

As the metal for the electrode, an alloy made of Zn/Sn/Cu/Sb and an alloy made of Zn/Sn/Cu were used. As the electrode for measurement, an electrode of an alloy made of Zn/Sn/Cu/Sb was used. Each of the alloys was thermally sprayed onto the end surface of the thermoelectric conversion member with adjusted Ra to form a metal layer having a thickness of 0.5 to 2.0 micrometers as an electrode. The thickness of the electrode was measured by Tencor-P10.

The Zn/Sn/Cu/Sb electrode in the thermoelectric conversion element having the formed electrode was soldered to a copper substrate, and this substrate was pulled in the axial direction of the thermoelectric conversion element, whereby a tensile breakage strength upon peeling the electrode from the thermoelectric conversion member was measured. As a result thereof, the tensile breakage strength was 0 to 10 gf (0 to 98 mN) when Ra was 0.8 micrometers, and the tensile breakage strength was 100 to 200 gf (0.98 to 1.96 N) when Ra was 4.5 micrometers. It has been confirmed that, when Ra is 0.8 micrometers, a tensile breakage strength larger than 0 is obtained. Also, it has been confirmed that, when Ra is 4.5 micrometers, higher tensile breakage strength is obtained. From these results, it has been at least confirmed that the electrode can be formed on the surface of the thermoelectric conversion element, the surface having Ra of 0.8 micrometers or more and 4.5 micrometers or less, can be formed, and the electrode contact to the surface at appropriate strength.

The present application claims priority rights based on Japanese Patent Application No. 2010-257591 filed on Nov. 18, 2010. All of the contents described in the specification of the application are incorporated in the specification of the present application.

INDUSTRIAL APPLICABILITY

As described above, according to the present invention, it is possible to obtain a thermoelectric conversion element, a thermoelectric conversion element module, and a method of manufacturing the same enabling a high-density arrangement and having element characteristics with a high connection reliability. Therefore, the present invention can be widely applied to cases in which direct conversion of heat to electricity is required in various fields of the art.

REFERENCE SIGNS LIST

1 thermoelectric conversion member
2 tube
3, 3' electrode
4, 4' end surface of thermoelectric conversion member
5 p-type element
6 n-type element
7 joining electrode
8, 9 current introduction terminal
10 ceramic substrate
100 thermoelectric conversion element
100*n*, 552 n-type thermoelectric conversion element
100*p*, 551, 553 p-type thermoelectric conversion element
101 thermoelectric conversion material
102 heat-resistant insulating material 103 funnel-shaped tube
104 vacuum pump
105 burner
106 heater
300 thermoelectric conversion element module
301 p-type thermoelectric conversion material
302 n-type thermoelectric conversion material
303 connecting electrode
311 to 316, 801 to 803, 810 to 814, 851, 852 electrode
401 Teflon (registered trademark) resin
402 heat-resistant adhesive agent
403 Teflon (registered trademark) block for positioning
501 tank
502 pump
600, 651 dummy pipe
601, 602, 611, 612 p-type thermoelectric conversion member group
650 dummy region
652 slit
660 p-type and n-type thermoelectric conversion member groups
701, 702, 711, 712 n-type thermoelectric conversion member group
901, 902 leading wire
1020 pipe
A length of one side in a lattice-shaped arrangement of thermoelectric conversion element group
B thickness of electrode 3
C arrow showing the cutting direction
E groove
G distance between the end surfaces of thermoelectric conversion material 1 and tube 2
G' distance between the assumed mounting dimension of the thermoelectric conversion member group and the thermoelectric conversion member on the outermost circumference
T thickness of thermoelectric conversion member group

The invention claimed is:

1. A thermoelectric conversion element module comprising:
the p-type thermoelectric conversion element includes a p-type thermoelectric conversion material filled in the inside of a hollow tube made of a heat-resistant insulating material; and
an n-type thermoelectric conversion element includes an n-type thermoelectric conversion material filled in the inside of a hollow tube made of a heat-resistant insulating material,
wherein the p-type thermoelectric conversion element and the n-type thermoelectric conversion element are electrically connected,
a plurality of the p-type thermoelectric conversion elements are arranged to form a p-type thermoelectric conversion element group,
a plurality of the n-type thermoelectric conversion elements are arranged to form an n-type thermoelectric conversion element group, and
an arrangement consisting of a plurality of hollow tubes made of only the heat-resistance insulating material is provided at an outside perimeter of an assembly of all thermoelectric conversion element groups including the p-type thermoelectric conversion element group and the n-type thermoelectric conversion element group.

2. The thermoelectric conversion element module according to claim 1, wherein an end surface of the p-type or n-type thermoelectric conversion material is concaved by 3 to 5 micrometers relative to an end surface of the hollow tube.

3. The thermoelectric conversion element module according to claim 1, wherein
the p-type thermoelectric conversion element group and the n-type thermoelectric conversion element group are electrically connected in series.

4. The thermoelectric conversion element module according to claim 3, wherein the p-type thermoelectric conversion element group and the n-type thermoelectric conversion element group are alternately arranged.

5. The thermoelectric conversion element module according to claim 3, wherein the p-type thermoelectric conversion element group and the n-type thermoelectric conversion element group are arranged to be adjacent to each other.

6. The thermoelectric conversion element module according to claim 3, wherein the arrangement constitutes a part or a whole of an outer circumference of the assembly.

7. The thermoelectric conversion element module according to claim 1, wherein a surface roughness Ra of an end surface of the hollow tube and an end surface of the p-type or n-type thermoelectric conversion material is larger than 0.8 micrometers and 4.5 micrometers or less.

* * * * *